(12) United States Patent
Lin

(10) Patent No.: US 8,895,358 B2
(45) Date of Patent: Nov. 25, 2014

(54) SEMICONDUCTOR DEVICE AND METHOD OF FORMING CAVITY IN PCB CONTAINING ENCAPSULANT OR DUMMY DIE HAVING CTE SIMILAR TO CTE OF LARGE ARRAY WLCSP

(75) Inventor: Yaojian Lin, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 714 days.

(21) Appl. No.: 12/557,763

(22) Filed: Sep. 11, 2009

(65) Prior Publication Data

US 2011/0062575 A1   Mar. 17, 2011

(51) Int. Cl.
*H01L 21/00*  (2006.01)
*H01L 29/40*  (2006.01)
(Continued)

(52) U.S. Cl.
CPC ....... *H01L 23/5389* (2013.01); *H01L 23/49827* (2013.01); *H01L 2924/01078* (2013.01); *H01L 2924/01006* (2013.01); *H01L 2924/01032* (2013.01); *H01L 2924/15153* (2013.01); *H01L 2924/01047* (2013.01); *H01L 2924/01004* (2013.01); *H01L 2924/15311* (2013.01); *H01L 2924/01033* (2013.01); *H01L 23/3128* (2013.01); *H01L 23/49816* (2013.01); *H01L 2224/73267* (2013.01); *H01L 2924/014* (2013.01); *H01L 2224/32225* (2013.01); *H01L 2924/01013* (2013.01); *H01L 24/48* (2013.01); *H01L 2924/1433* (2013.01); *H01L 2924/30105* (2013.01); *H01L 24/24* (2013.01); *H01L 2924/10329* (2013.01); *H01L 2224/76155* (2013.01); *H01L 2924/01049* (2013.01); *H01L 2924/01322* (2013.01); *H01L 2924/19041* (2013.01); *H01L 2924/15183* (2013.01); *H01L 2224/48091* (2013.01); *H01L 2224/73265* (2013.01); *H01L 2924/13091* (2013.01); *H01L 23/13* (2013.01); *H01L 2924/01029* (2013.01); *H01L 2924/01082* (2013.01); *H01L 2224/82102* (2013.01); *H01L 2224/48247* (2013.01); *H01L 2224/16* (2013.01); *H01L 2224/16225* (2013.01); *H01L 2224/24227* (2013.01); *H01L 2924/14* (2013.01); *H01L 2924/01079* (2013.01)
USPC ............................................ 438/108; 257/778

(58) Field of Classification Search
USPC ............................................ 438/108; 257/778
See application file for complete search history.

(56) References Cited

U.S. PATENT DOCUMENTS 5,250,843 A   10/1993   Eichelberger
5,353,498 A   10/1994   Fillion et al.
(Continued)

FOREIGN PATENT DOCUMENTS

CN        1560922 A      1/2005
CN      101473424 A      7/2009
(Continued)

*Primary Examiner* — James Mitchell
(74) *Attorney, Agent, or Firm* — Robert D. Atkins; Patent Law Group: Atkins and Associates, P.C.

(57) ABSTRACT

A semiconductor device has a PCB with a cavity formed in a first surface of the PCB. A stress compensating structure, such as an encapsulant or dummy die, is disposed in the cavity. An insulating layer is formed over the PCB and stress compensating structure. A portion of the insulating layer is removed to expose the stress compensating structure. A conductive layer is formed over the stress compensating structure. A solder masking layer is formed over the conductive layer with openings to the conductive layer. A semiconductor package is mounted over the cavity. The semiconductor package is a large array WLCSP. Bumps electrically connect the semiconductor package and conductive layer. The semiconductor package is electrically connected to the conductive layer. The CTE of the stress compensating structure is selected substantially similar to or matching the CTE of the semiconductor package to reduce stress between the semiconductor package and PCB.

31 Claims, 4 Drawing Sheets

(51) Int. Cl.
  *H01L 23/538* (2006.01)
  *H01L 23/13* (2006.01)
  *H01L 23/498* (2006.01)
  *H01L 23/31* (2006.01)
  *H01L 23/00* (2006.01)

(56) References Cited

U.S. PATENT DOCUMENTS

| | | | |
|---|---|---|---|
| 5,723,347 A * | 3/1998 | Hirano et al. | 29/25.01 |
| 5,841,193 A | 11/1998 | Eichelberger | |
| 6,324,754 B1 * | 12/2001 | DiStefano et al. | 29/840 |
| 7,271,086 B2 * | 9/2007 | Tang et al. | 438/620 |
| 7,319,050 B2 * | 1/2008 | Chang et al. | 438/108 |
| 7,327,018 B2 | 2/2008 | Chung | |
| 7,619,901 B2 | 11/2009 | Eichelberger et al. | |
| 7,638,418 B2 * | 12/2009 | Bauer et al. | 438/612 |
| 7,763,965 B2 * | 7/2010 | Webb | 257/687 |
| 7,928,582 B2 * | 4/2011 | Hutto | 257/778 |
| 7,932,613 B2 * | 4/2011 | Child | 257/779 |
| 8,263,434 B2 * | 9/2012 | Pagaila et al. | 438/109 |
| 2005/0006788 A1 * | 1/2005 | Kaneko | 257/778 |
| 2005/0046039 A1 * | 3/2005 | Yang et al. | 257/778 |
| 2006/0170098 A1 | 8/2006 | Hsu | |
| 2006/0214293 A1 * | 9/2006 | Park et al. | 257/737 |
| 2007/0246813 A1 | 10/2007 | Ong et al. | |
| 2007/0290339 A1 * | 12/2007 | Suh et al. | 257/737 |
| 2008/0029870 A1 * | 2/2008 | Chen et al. | 257/686 |
| 2008/0197469 A1 * | 8/2008 | Yang et al. | 257/686 |
| 2008/0229827 A1 * | 9/2008 | Ozawa | 73/514.35 |
| 2008/0246135 A1 | 10/2008 | Wong et al. | |
| 2008/0290491 A1 * | 11/2008 | Yamano et al. | 257/686 |
| 2008/0296716 A1 * | 12/2008 | Chan et al. | 257/433 |
| 2010/0140779 A1 * | 6/2010 | Lin et al. | 257/690 |
| 2011/0095422 A1 | 4/2011 | Hashimoto | |

FOREIGN PATENT DOCUMENTS

| | | | |
|---|---|---|---|
| JP | 61207037 | * | 9/1986 |
| JP | 20002993398 A | | 10/2000 |
| WO | WO 97/44859 | * | 11/1997 |

* cited by examiner

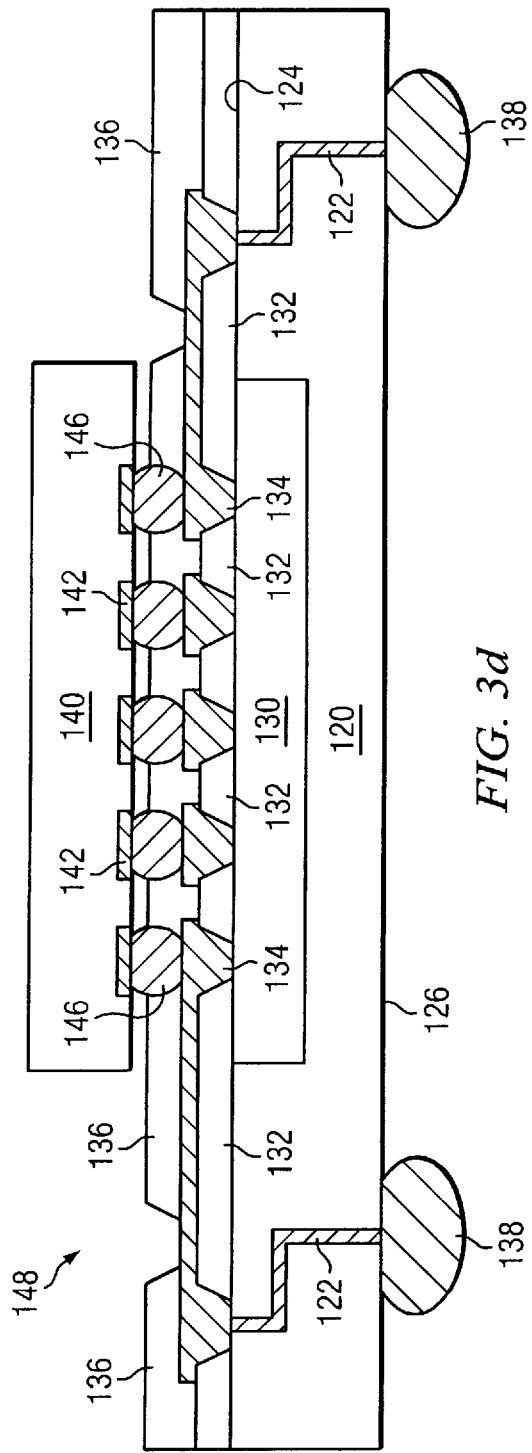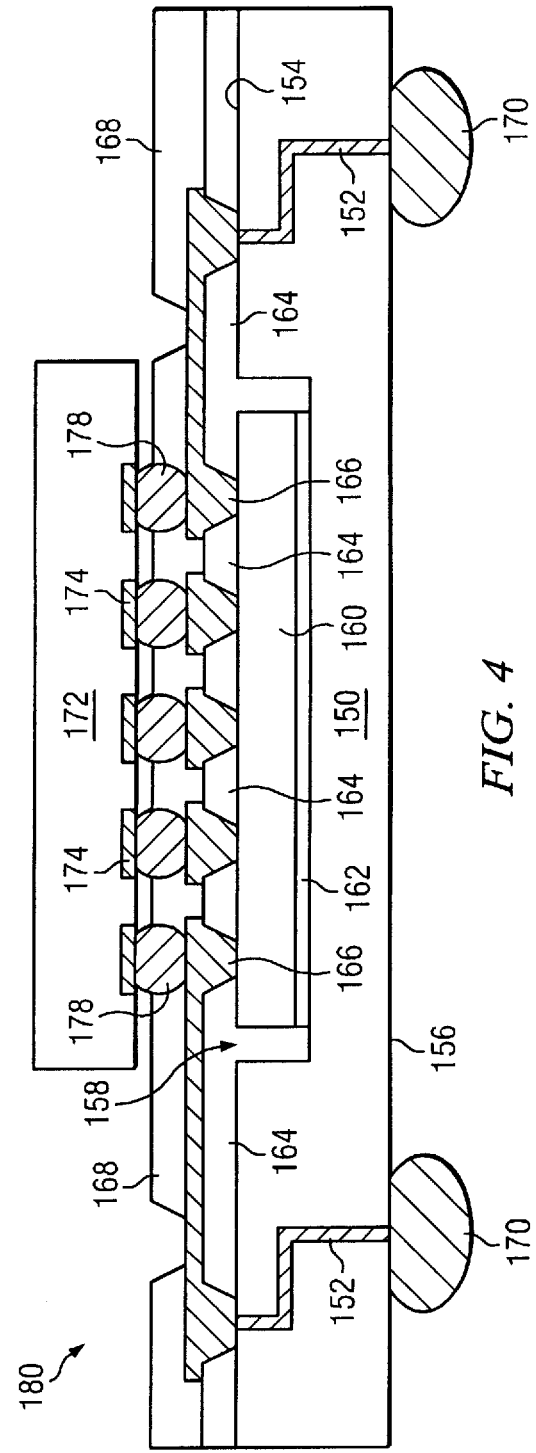

SEMICONDUCTOR DEVICE AND METHOD OF FORMING CAVITY IN PCB CONTAINING ENCAPSULANT OR DUMMY DIE HAVING CTE SIMILAR TO CTE OF LARGE ARRAY WLCSP

FIELD OF THE INVENTION

The present invention relates in general to semiconductor devices and, more particularly, to a semiconductor device and method of forming a cavity in a printed circuit board or substrate containing an encapsulant or dummy die having a CTE similar to the CTE of a large array WLCSP.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In wafer level chip scale packages (WLCSP) and fan-out wafer level chip scale packages (FO-WLCSP), semiconductor die are stacked and vertically interconnected within the package. As the need for signal processing capacity increases, large arrays of stacked semiconductor die are commonly housed within the WLCSP and FO-WLCSP. The large array WLCSP/FO-WLCSP are mounted to a PCB. However, the large array WLCSP/FO-WLCSP can cause failures and reduce board level reliability, particularly during temperature cycling testing, due in part to stress induced by mismatches in the coefficient of thermal expansion (CTE) between the PCB and large array WLCSP/FO-WLCSP.

SUMMARY OF THE INVENTION

A need exists for large array WLCSP/FO-WLCSP on PCBs without adversely effecting board level reliability. Accordingly, in one embodiment, the present invention is a method of making a semiconductor device comprising the steps of providing a substrate, forming a cavity in a first surface of the substrate, depositing an encapsulant having a CTE in the cavity, forming an insulating layer over the substrate and encapsulant, removing a portion of the insulating layer to expose the encapsulant, forming a first conductive layer over the encapsulant, and mounting a semiconductor package having a CTE over the cavity. The semiconductor package is electrically connected to the first conductive layer. The CTE of the encapsulant is selected similar to the CTE of the semiconductor package to reduce stress between the semiconductor package and substrate.

In another embodiment, the present invention is a method of making a semiconductor device comprising the steps of providing a substrate, forming a cavity in a first surface of the substrate, mounting a stress compensating structure having a CTE in the cavity, forming an insulating layer over the substrate and stress compensating structure, removing a portion of the insulating layer to expose the stress compensating structure, forming a conductive layer over the stress compensating structure, and mounting a semiconductor package having a CTE over the cavity. The semiconductor package is electrically connected to the conductive layer. The CTE of the stress compensating structure is selected similar to the CTE of the semiconductor package to reduce stress between the semiconductor package and substrate.

In another embodiment, the present invention is a method of making a semiconductor device comprising the steps of providing a substrate, forming a cavity in a first surface of the substrate, disposing a stress compensating structure having a CTE in the cavity, forming a conductive layer over the stress compensating structure, and mounting a semiconductor package having a CTE over the cavity. The semiconductor package is electrically connected to the conductive layer. The CTE of the stress compensating structure is selected similar to the CTE of the semiconductor package to reduce stress between the semiconductor package and substrate.

In another embodiment, the present invention is a semiconductor device comprising a substrate having a cavity formed in a first surface of the substrate. A stress compensating structure having a CTE is disposed in the cavity. A conductive layer is formed over the stress compensating structure. A semiconductor package having a CTE is mounted over the cavity. The semiconductor package is electrically connected to the conductive layer. The CTE of the stress compensating structure is selected similar to the CTE of the semiconductor package to reduce stress between the semiconductor package and substrate.

BRIEF DESCRIPTION OF THE DRAWINGS

FIGS. 3a-3d illustrate a process of forming a cavity in a PCB filled with encapsulant having a CTE matching that of a FO-WLCSP mounted over the cavity; and FIG. 4 illustrates a PCB having a cavity containing a dummy die having CTE matching that of the FO-WLCSP mounted over the cavity.

DETAILED DESCRIPTION OF THE DRAWINGS

Figure 1:
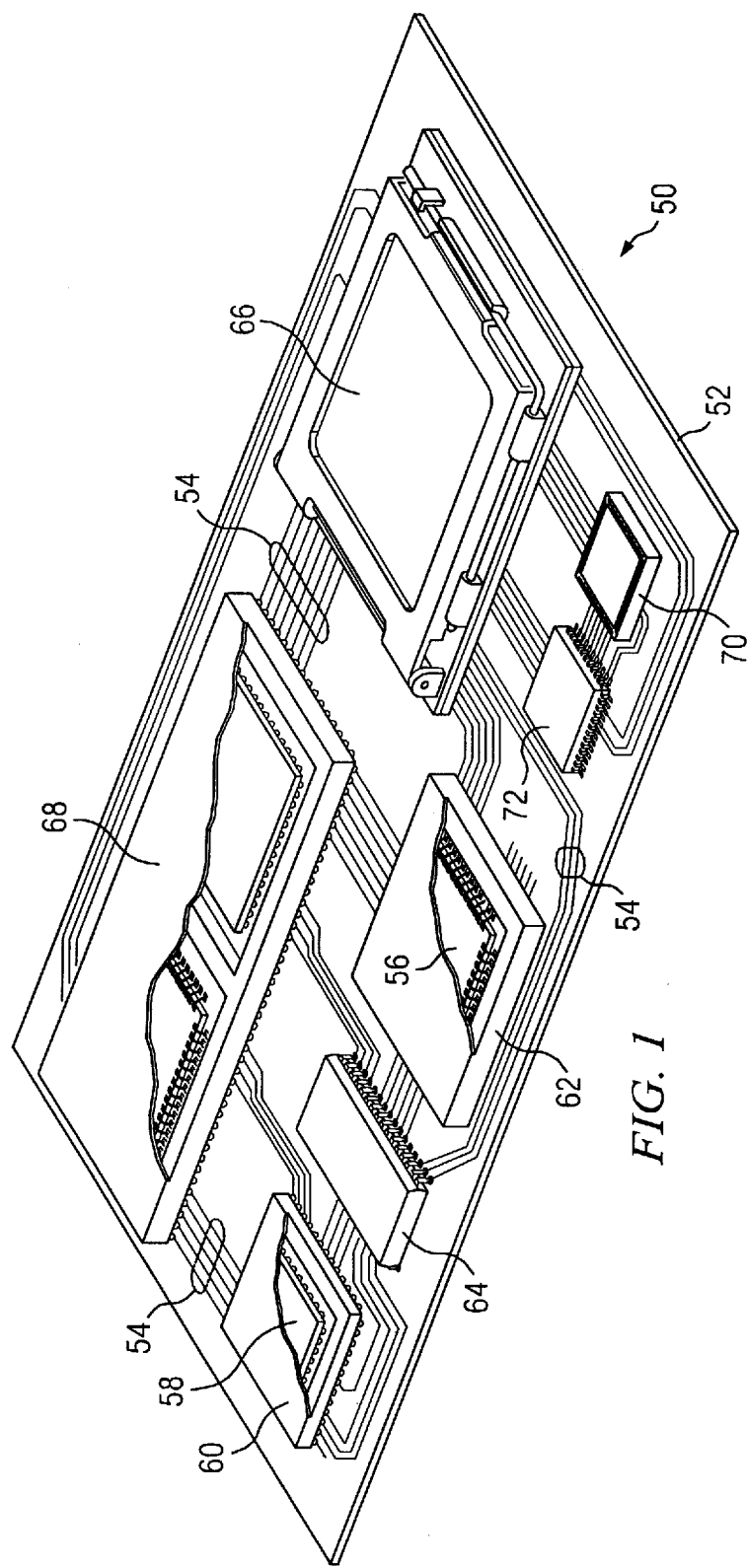
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
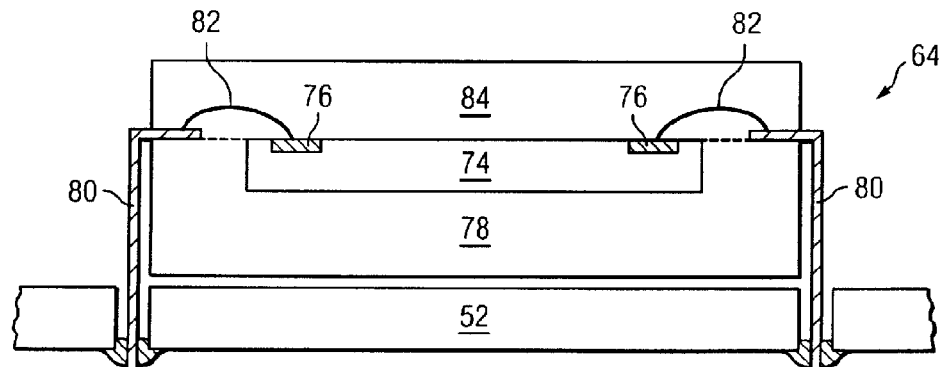
FIGS. 2a-2c illustrate further detail of the representative semiconductor packages mounted to the PCB.
Figure 2B:
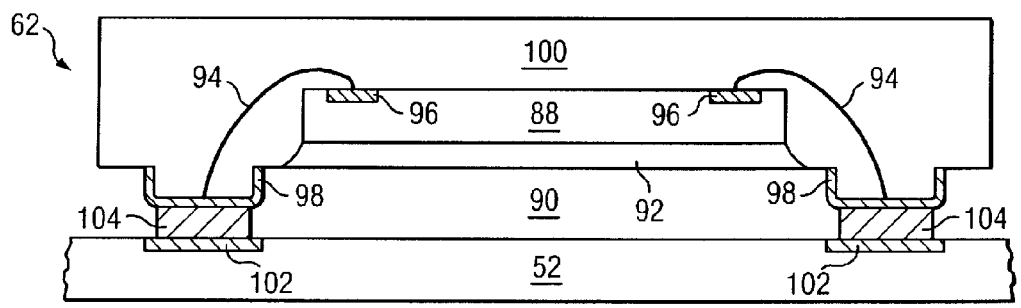
Figure 2C:
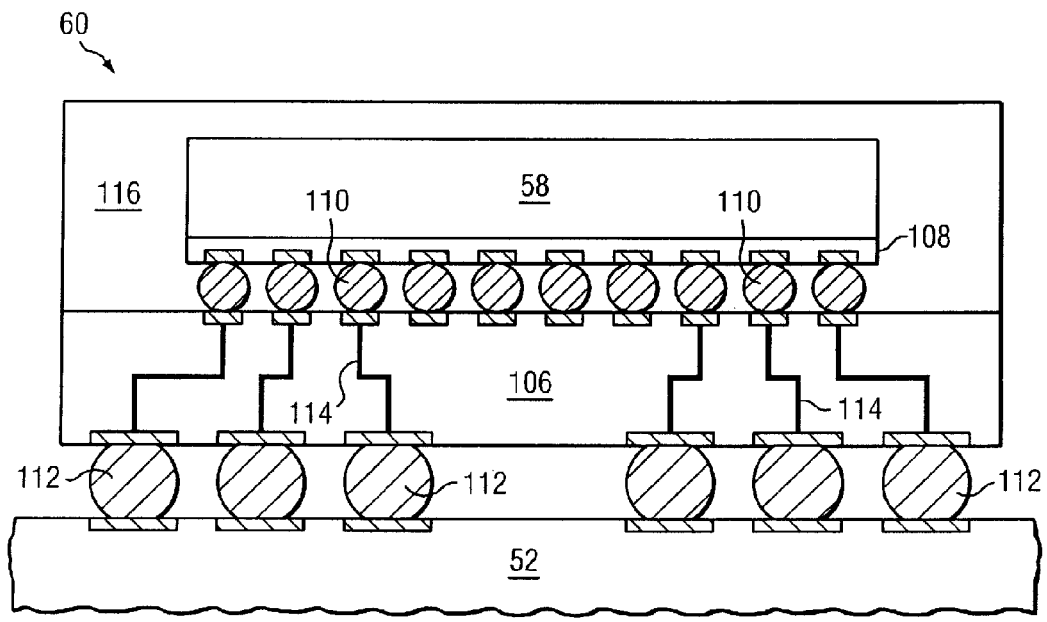

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
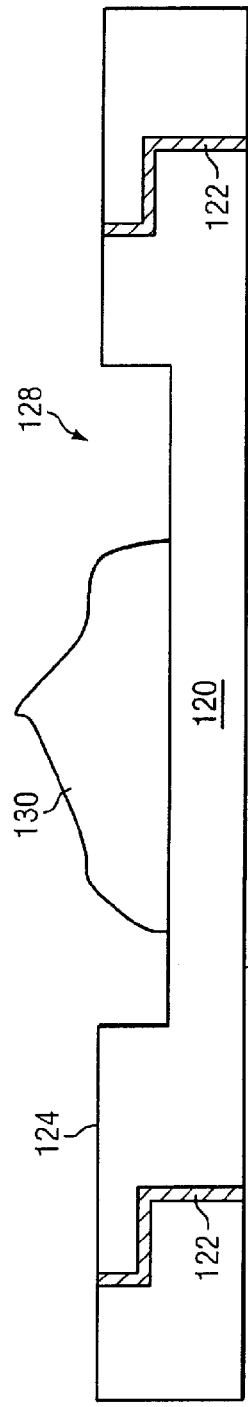

FIGS. 3a-3d illustrate, in relation to FIGS. 1 and 2a-2c, a process of forming a cavity in a PCB or substrate filled with an encapsulant having a CTE substantially similar to or matching that of a WLCSP or FO-WLCSP mounted over the cavity. In FIG. 3a, PCB or substrate 120 is a mechanical support structure for electronic components with point-to-point electrical interconnect according to the design of the PCB. PCB 120 has one or more conductive layers 122 laminated with a non-conductive or dielectric substrate. The substrate can be one or more laminated layers of polytetrafluoroethylene pre-impregnated (prepreg) with a combination of phenolic cotton paper, epoxy, resin, woven glass, matte glass, polyester, and other reinforcement fibers or fabrics. PCB 120 has a high dielectric constant, low loss tangent, and density of about 2.15 g/cm3. Conductive layer 122 can be one or more layers of Al, Cu, Sn, Ni, Au, Ag, or other suitable electrically conductive material formed by electrolytic plating or electroless plating for electrical interconnect. The layout of PCB 120 and conductive layer 122 typically uses silk screen printing, photoengraving, PCB milling, electroless plating, or electroplating process. PCB 120 may have a plurality of vias cut with drill bits or laser drilling. Conductive layer 122 extends from top surface 124 to bottom surface 126 of PCB 120.

A cavity 128 is formed in surface 124 having an area approximately the size as semiconductor package 140 later mounted over the cavity. Cavity 128 can be formed by laser, drilling, router, skiving, or scoring. In one embodiment, for PCB 120 having a thickness of 100-800 micrometers (μm), cavity 128 is formed to a depth of 50-600 μm.

Figure 3B:
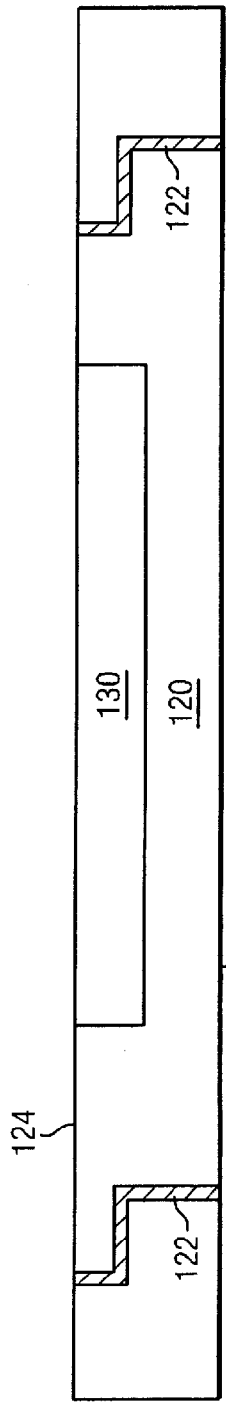
Figure 3C:
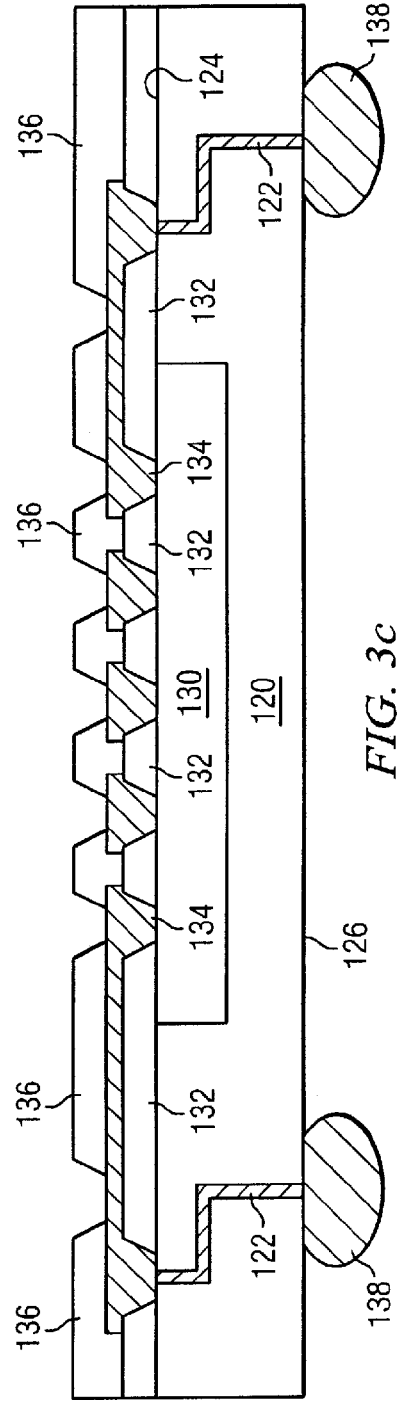

In FIG. 3c, an encapsulant or molding compound 130 is deposited in cavity 128 using a paste printing, compressive molding, transfer molding, liquid encapsulant molding, vacuum lamination, spin coating, or other suitable applicator.

Encapsulant 130 can be polymer composite material, such as epoxy resin with filler, epoxy acrylate with filler, or polymer with proper filler. In one embodiment, encapsulant 130 is dispensed into cavity 128 by a jetting dispense process under precision volume control to dispense the proper amount of encapsulant to fill cavity 128. The dispensed encapsulant 130 is molded to a level co-planar with top surface 124 of PCB 120, as shown in FIG. 3b.

In FIG. 3c, an optional insulating or passivation layer 132 is formed over PCB 120 and encapsulant 130. The insulating layer 132 can be one or more layers of photosensitive insulation polymer material. The insulating layer 132 is formed using lamination, printing, spin coating, or spray coating. A portion of insulating layer 132 is removed by an etching process or laser drilling to expose conductive layer 122 and encapsulant 130.

An electrically conductive layer 134 is formed over conductive layer 122, encapsulant 130, and insulating layer 132 using a patterning and metal deposition process such as PVD, CVD, sputtering, electrolytic plating, and electroless plating process. Conductive layer 134 can be one or more layers of Al, Cu, Sn, Ni, Au, Ag, or other suitable electrically conductive material. One portion of conductive layer 134 is electrically connected to conductive layer 122. Other portions of conductive layer 134 can be electrically common or electrically isolated depending on the design and function of the semiconductor device.

A solder masking layer 136 is formed over PCB 120 with openings to expose conductive layer 134 for next level interconnect. The opening in solder masking layer 136 may not precisely overlap the opening in insulating layer 132.

An electrically conductive bump material is deposited over bottom surface 126 of PCB 120 and electrically connected to conductive layer 122 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form spherical balls or bumps 138. In some applications, bumps 138 are reflowed a second time to improve electrical contact to conductive layer 122. The bumps can also be compression bonded to conductive layer 122. Bumps 138 represent one type of interconnect structure that can be formed over conductive layer 122. The interconnect structure can also use bond wires, stud bump, micro bump, or other electrical interconnect on either the top surface or bottom surface of PCB 120.

In FIG. 3d, semiconductor package or component 140 is mounted over cavity 128 containing encapsulant 130 with contact pads 142 oriented toward PCB 120. Semiconductor package 140 is a WLCSP or FO-WLCSP containing a large array of stacked semiconductor die. Each semiconductor die contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface of the die to implement analog circuits or digital circuits, such as digital signal processor (DSP), ASIC, memory, or other signal processing circuit. Semiconductor package 140 may also contain IPD, such as inductors, capacitors, and resistors, for RF signal processing. A typical RF system requires multiple IPDs in one or more semiconductor packages to perform the necessary electrical functions. Bumps 146 electrically connect contact pads 142 to conductive layer 134. Bumps 146 can be Al, Sn, Ni, Au, Ag, Pb, Bi, Cu, solder, and combinations thereof.

The electronic system 148 has semiconductor package 140 mounted over cavity 128 in PCB 120, as described in FIGS. 3a-3d. Semiconductor package 140 is a WLCSP or FO-WLCSP containing a large array of stacked semiconductor die for additional signal processing capability. Semiconductor package 140 has a base material such as silicon, germanium, gallium arsenide, indium phosphide, or silicon carbide, for structural support. Encapsulant 130 is a stress compensating structure selected to have a CTE substantially similar to or matching the CTE of the base material of semiconductor package 140, e.g., silicon having a CTE of 2-10× $10^{-6}$/° C. The reliability of electronic system 148 is enhanced by mounting semiconductor package 140 over cavity 128 filled with encapsulant 130 because the CTE of the encapsulant is selected to be similar to the CTE of the base material of the package. Any expansion or contraction of semiconductor package 140 due to temperature variation is transmitted through conductive layer 134 and compensated by encapsulant 130 having a similar thermal expansion property. The substantially similar CTE of semiconductor package 140 and encapsulant 130 reduces stress and associated failures, particularly during temperature cycling testing.

FIG. 4 shows a dummy die mounted in the cavity of the PCB or substrate. The dummy die has a CTE substantially similar to or matching the CTE of the WLCSP or FO-WLCSP mounted over the cavity. PCB or substrate 150 provides mechanical support structure for electronic components with point-to-point electrical interconnect according to the design of the PCB. PCB 150 has one or more conductive layers 152 laminated with a non-conductive or dielectric substrate. The substrate can be one or more laminated layers of polytetrafluoroethylene pre-impregnated with a combination of phenolic cotton paper, epoxy, resin, woven glass, matte glass, polyester, and other reinforcement fibers or fabrics. PCB 150 has a high dielectric constant, low loss tangent, and density of about 2.15 g/cm3. Conductive layer 152 can be one or more layers of Al, Cu, Sn, Ni, Au, Ag, or other suitable electrically conductive material formed by electrolytic plating or electroless plating for electrical interconnect. The layout of PCB 150 and conductive layer 152 typically uses silk screen printing, photoengraving, PCB milling, electroless plating, or electroplating process. PCB 150 may have a plurality of vias cut with drill bits or laser drilling. Conductive layer 152 extends from top surface 154 to bottom surface 156 of PCB 150.

A cavity 158 is formed in surface 154 having an area approximately the size as a semiconductor die later mounted over the cavity. Cavity 158 can be formed by laser, drilling, router, skiving, or scoring. In one embodiment, for PCB 150 having a thickness of 100-800 μm, cavity 158 is formed to a depth of 50-600 μm.

A dummy die 160 is mounted in cavity 158 with die attach adhesive 162. Dummy die 160 may have an active surface or no active surface. For example, the dummy die can have only the inductor on the surface. An optional encapsulant or molding compound is deposited around dummy die 160 using a paste printing, compressive molding, transfer molding, liquid encapsulant molding, vacuum lamination, spin coating, or other suitable applicator. The encapsulant can be polymer composite material, such as epoxy resin with filler, epoxy acrylate with filler, or polymer with proper filler. The top surface of dummy die 160 is co-planar with top surface 154.

An insulating or passivation layer 164 is formed over PCB 150 and dummy die 160. The insulating layer 164 can be one or more layers of photosensitive insulation polymer material. The insulating layer 164 is formed using lamination, printing, spin coating, or spray coating. A portion of insulating layer 164 is removed by an etching process or laser drilling to expose conductive layer 152 and dummy die 160.

An electrically conductive layer 166 is formed over conductive layer 152, dummy die 160, and insulating layer 164 using a patterning and metal deposition process such as PVD, CVD, sputtering, electrolytic plating, and electroless plating process. Conductive layer 166 can be one or more layers of Al, Cu, Sn, Ni, Au, Ag, or other suitable electrically conductive material. One portion of conductive layer 166 is electrically connected to conductive layer 152. Other portions of conductive layer 166 can be electrically common or electrically isolated depending on the design and function of the semiconductor device.

A solder masking layer 168 is formed over PCB 160 with openings to expose conductive layer 166 for next level interconnect. The opening in solder masking layer 168 may not precisely overlap the opening in insulating layer 164.

An electrically conductive bump material is deposited over bottom surface 156 of PCB 150 and electrically connected to conductive layer 152 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 152 using a suitable attachment or bonding process. In one embodiment, the bump material is reflowed by heating the material above its melting point to form spherical balls or bumps 170. In some applications, bumps 170 are reflowed a second time to improve electrical contact to conductive layer 152. The bumps can also be compression bonded to conductive layer 152. Bumps 170 represent one type of interconnect structure that can be formed over conductive layer 122. The interconnect structure can also use bond wires, stud bump, micro bump, or other electrical interconnect.

A semiconductor package or component 172 is mounted over cavity 158 containing dummy die 160 with contact pads 174 oriented toward PCB 150. Semiconductor package 172 is a WLCSP or FO-WLCSP containing a plurality of stacked semiconductor die. Each semiconductor die contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface of the die to implement analog circuits or digital circuits, such as DSP, ASIC, memory, or other signal processing circuit. Semiconductor package 172 may also contain IPD, such as inductors, capacitors, and resistors, for RF signal processing. A typical RF system requires multiple IPDs in one or more semiconductor packages to perform the necessary electrical functions. Bumps 178 electrically connect contact pads 174 to conductive layer 166. Bumps 178 can be Al, Sn, Ni, Au, Ag, Pb, Bi, Cu, solder, and combinations thereof.

The electronic system 180 has semiconductor package 172 mounted over cavity 158 in PCB 150. Semiconductor package 172 is a WLCSP or FO-WLCSP containing a large array of stacked semiconductor die for additional signal processing capability. Semiconductor package 172 has a base material such as silicon, germanium, gallium arsenide, indium phosphide, or silicon carbide, for structural support. Dummy die 160, with optional encapsulant, is a stress compensating structure selected to have a CTE substantially similar to or matching the CTE of the base material of semiconductor package 172, e.g., silicon having a CTE of $2\text{-}10\times10^{-6}/^\circ$ C. The reliability of electronic system 180 is enhanced by mounting semiconductor package 172 over cavity 158 containing dummy die 160 because the CTE of the dummy die is selected to be similar to the CTE of the base material of the semiconductor package. Any expansion or contraction of semiconductor package 172 due to temperature variation is transmitted through conductive layer 134 and compensated by dummy die 160 having a similar thermal expansion property. The substantially similar CTE of semiconductor package 172 and dummy die 160 reduces stress and associated failures, particularly during temperature cycling testing.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a cavity through a first surface of the substrate;
   depositing a non-conductive encapsulant in the cavity;
   forming an insulating layer over the substrate and the non-conductive encapsulant;
   removing a portion of the insulating layer to expose the non-conductive encapsulant;
   forming a first conductive layer over the non-conductive encapsulant; and
   mounting a semiconductor package over the cavity, the semiconductor package being electrically connected to the first conductive layer, wherein the non-conductive encapsulant has a coefficient of thermal expansion (CTE) selected similar to a CTE of the semiconductor package to reduce stress between the semiconductor package and the substrate.

2. The method of claim 1, further including forming a solder masking layer over the first conductive layer.

3. The method of claim 1, further including forming bumps between the semiconductor package and first conductive layer.

4. The method of claim 1, further including:
   forming a second conductive layer in the substrate; and
   forming bumps on a second surface of the substrate opposite the first surface of the substrate, the second conductive layer being electrically connected to the bumps.

5. The method of claim 1, further including:
   depositing the non-conductive encapsulant with a jetting dispense process; and
   molding the non-conductive encapsulant such that a surface of the non-conductive encapsulant is co-planar with the first surface of the substrate.

6. The method of claim 1, wherein the semiconductor package is a large array wafer level chip scale package.

7. A method of making a semiconductor device, comprising:
   providing a substrate;
   forming a cavity through a surface of the substrate;
   disposing a stress compensating structure including an insulating material or a dummy die in the cavity;
   planarizing a surface of the substrate with a surface of the stress compensating structure;

forming an insulating layer over the planarized surface of the substrate and the stress compensating structure;

removing a portion of the insulating layer to expose the stress compensating structure;

forming a conductive layer over the stress compensating structure; and disposing a semiconductor package over the cavity, the semiconductor package being electrically connected to the conductive layer, wherein the stress compensating structure has a coefficient of thermal expansion (CTE) selected similar to a CTE of the semiconductor package to reduce stress between the semiconductor package and the substrate.

8. The method of claim 7, wherein the stress compensating structure includes an encapsulant.

9. The method of claim 7, wherein the stress compensating structure includes a dummy die.

10. The method of claim 9, further including depositing an encapsulant over the dummy die.

11. The method of claim 9, further including forming an inductor over the dummy die.

12. The method of claim 7, further including forming a solder masking layer over the conductive layer.

13. The method of claim 7, wherein the semiconductor package is a large array wafer level chip scale package.

14. A method of making a semiconductor device, comprising:

providing a substrate;

forming a cavity through a surface of the substrate;

disposing a stress compensating structure including an insulating or semiconductor material in the cavity with a surface of the stress compensating structure co-planar with the surface of the substrate;

forming a conductive layer over the stress compensating structure; and disposing a semiconductor package over the cavity, the semiconductor package being electrically connected to the conductive layer, wherein the stress compensating structure has a coefficient of thermal expansion (CTE) similar to a CTE of the semiconductor package to reduce stress between the semiconductor package and the substrate.

15. The method of claim 14, further including:

forming an insulating layer over the substrate and the stress compensating structure; and removing a portion of the insulating layer to expose the stress compensating structure.

16. The method of claim 14, wherein the stress compensating structure includes an encapsulant.

17. The method of claim 16, further including depositing the encapsulant with a jetting dispense process.

18. The method of claim 14, wherein the stress compensating structure includes a dummy die.

19. The method of claim 14, further including forming a solder masking layer over the conductive layer.

20. The method of claim 14, further including forming bumps between the semiconductor package and the conductive layer.

21. A semiconductor device, comprising:

a substrate including a cavity formed through a surface of the substrate;

a stress compensating structure including an insulating material or a dummy die disposed in the cavity with a surface of the stress compensating structure co-planar with the surface of the substrate an insulating layer formed over the substrate and a first portion of the stress compensating structure including an opening in the insulating layer over the stress compensating structure;

a conductive layer formed over the insulating layer stress compensating structure and in contact with the stress compensating structure; and a semiconductor package disposed over the cavity, the semiconductor package being electrically connected to the conductive layer, wherein the stress compensating structure has a coefficient of thermal expansion (CTE) similar to a CTE of the semiconductor package to reduce stress between the semiconductor package and the substrate.

22. The semiconductor device of claim 21, wherein the stress compensating structure includes an encapsulant.

23. The semiconductor device of claim 21, wherein the stress compensating structure includes a dummy die with an inductor formed over the surface of the stress compensating structure.

24. The semiconductor device of claim 21, further including bumps formed between the semiconductor package and the conductive layer.

25. The semiconductor device of claim 21, wherein the semiconductor package is a large array wafer level chip scale package.

26. A method of making a semiconductor device, comprising:

providing a substrate;

forming a cavity through a surface of the substrate;

disposing a stress compensating structure in the cavity, wherein the stress compensating structure includes a dummy die; forming an insulating layer over the substrate and the stress compensating structure; forming an opening in the insulating layer over the stress compensating structure;

forming an interconnect structure over the insulating layer and the stress compensating structure; and disposing a semiconductor package including first and second contact pads over the interconnect structure with the first and second contact pads disposed within a footprint of the cavity.

27. The method of claim 26, wherein the stress compensating structure has a coefficient of thermal expansion (CTE) similar to a CTE of the semiconductor package to reduce stress between the semiconductor package and the substrate.

28. The method of claim 26, wherein the stress compensating structure includes an insulating material.

29. The method of claim 26, further including depositing an encapsulant over the dummy die.

30. The method of claim 29, wherein a surface of the stress compensating structure is coplanar with the surface of the substrate.

31. The method of claim 26, further including:

forming an insulating layer over the substrate and the stress compensating structure; and removing a portion of the insulating layer to expose the stress compensating structure.

* * * * *